US012593390B2

(12) United States Patent
Lin et al.

(10) Patent No.: US 12,593,390 B2
(45) Date of Patent: Mar. 31, 2026

(54) ELECTROSTATIC DISCHARGE PREVENTION PUMP

(71) Applicant: TAIWAN SEMICONDUCTOR MANUFACTURING COMPANY, LTD., Hsinchu (TW)

(72) Inventors: Tzu-Yang Lin, Tainan (TW); Yu-Cheng Chang, Hsinchu (TW); Cheng-Han Wu, Taichung (TW); Shang-Sheng Li, Zhubei (TW); Chen-Yu Liu, Kaohsiung (TW); Chen Yi Hsu, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 273 days.

(21) Appl. No.: 17/401,244

(22) Filed: Aug. 12, 2021

(65) Prior Publication Data

US 2023/0050816 A1     Feb. 16, 2023

(51) Int. Cl.
| | |
|---|---|
| H05F 3/02 | (2006.01) |
| B05C 11/08 | (2006.01) |
| G03F 7/16 | (2006.01) |
| H01L 21/67 | (2006.01) |

(52) U.S. Cl.
CPC ............... H05F 3/02 (2013.01); B05C 11/08 (2013.01); G03F 7/164 (2013.01); H01L 21/67017 (2013.01); H01L 21/6715 (2013.01)

(58) Field of Classification Search
CPC ....... G03F 7/16–18; B05C 11/08; H05F 3/02; H01L 21/67017; H01L 21/6715
See application file for complete search history.

(56) References Cited

U.S. PATENT DOCUMENTS

| | | | | |
|---|---|---|---|---|
| 4,289,278 | A * | 9/1981 | Itoh ........................... | B05B 5/10 |
| | | | | 239/105 |
| 2017/0087575 | A1* | 3/2017 | Hashima ........... | H01L 21/67051 |
| 2018/0334318 | A1* | 11/2018 | Cho ......................... | C09D 5/24 |
| 2020/0174372 | A1* | 6/2020 | Hsu ................... | H01L 21/67017 |

* cited by examiner

*Primary Examiner* — Yewebdar T Tadesse
*Assistant Examiner* — Stephen A Kitt
(74) *Attorney, Agent, or Firm* — STUDEBAKER BRACKETT PLLC

(57) ABSTRACT

A dispensing system includes a dispense material supply that contains a dispense material and a dispensing pump connected downstream from the dispense material supply. The dispensing pump includes a body made of a first electrically conductive material, one or more first electrical contacts that are disposed on the body of the dispensing pump, and one or more first connection wires that are coupled between each one of the one or more first electrical contacts and ground. The dispensing system also includes a dispensing nozzle connected downstream from the dispensing pump and includes a tube made of a second electrically conductive material, one or more second electrical contacts that are disposed on an outer surface of the tube, and one or more second connection wires that are coupled between each one of the one or more second electrical contacts and the ground.

20 Claims, 8 Drawing Sheets

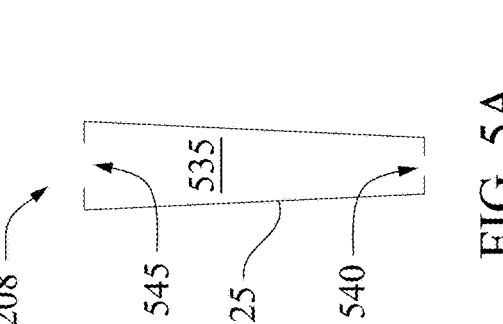
FIG. 5A
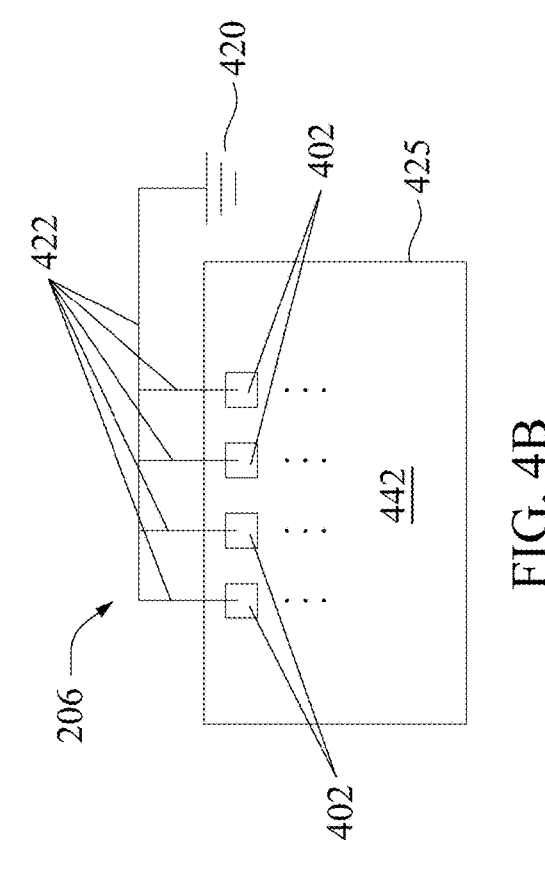
FIG. 5B
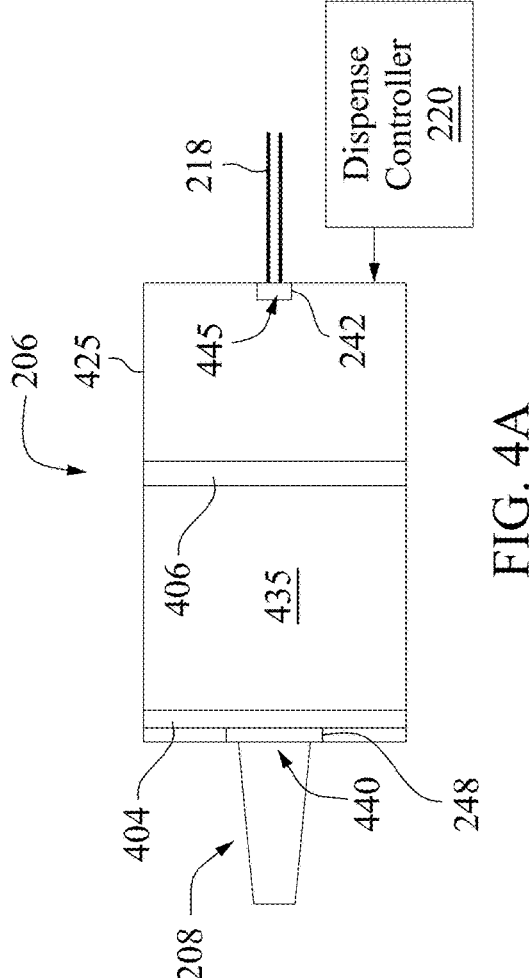
FIG. 4A
Dispense Controller 220
FIG. 4B

ELECTROSTATIC DISCHARGE PREVENTION PUMP

BACKGROUND

During an integrated circuit (IC) design, a number of patterns of the IC, for different steps of IC processing, are generated on a substrate, e.g., a wafer. The patterns may be produced by projecting, e.g., imaging, layout patterns of a photo mask on a photo resist layer of the substrate. A lithographic process transfers the layout patterns of the photo mask to the photo resist layer of the substrate such that etching, implantation, or other steps are applied only to predefined regions of the substrate. The layout patterns transferred by projection are developed to produce the resist patterns on the substrate. When a negative tone resist pattern is used for photo resist layer of the substrate, a negative tone developer is used to develop the projected patterns and to generate the resist pattern on the substrate. The negative developer is disposed via a developer dispenser system that includes a developer dispensing pump and a dispensing nozzle. In general, the negative tone developer collects electrostatic charge inside the developer dispensing pump and the dispensing nozzle that, due to high electrical resistivity, may build up a high voltage and cause large electrical discharges inside the developer dispensing pump and the dispensing nozzle. The large electrical discharges inside the developer dispensing pump and the dispensing nozzle may damage and detach particles from the developer dispensing pump and the dispensing nozzle. The particles may be deposited on the substrate and cause defects in subsequent processing steps of the substrate. Therefore, it is desirable to limit the built up voltage of the negative tone developer to limit the electrical discharges inside the developer dispensing pump and the dispensing nozzle, thereby preventing damage to the developer dispensing pump and the dispensing nozzle.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A and 4B show the dispensing pump in accordance with some embodiments of the present disclosure.

FIGS. 5A and 5B show the dispensing nozzle of the dispensing pump in accordance with some embodiments of the present disclosure.

DETAILED DESCRIPTION

Figure 1:
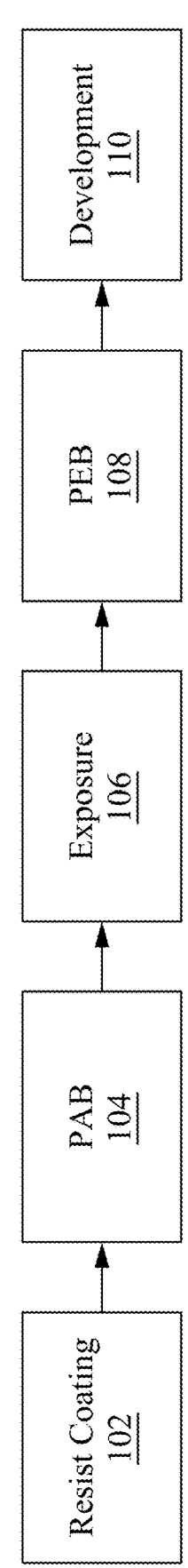
FIG. 1 shows a process flow for generating a resist pattern on a semiconductor substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, a dispensing system is used for dispensing a dispense material, e.g., a developer solution for development of a negative tone photo resist in an extreme ultraviolet (EUV) lithographic system. The dispense material may have a high electrical resistivity and when the dispense material flows the motion of the fluid creates a static electric charge that may be collected in the dispense material and may essentially remain in the dispense material due to its high electrical resistivity until it is discharged. In some embodiments, the collected electric charge in the dispense material reaches a threshold and the charged dispense material generates an electrical discharge, e.g., a spark, with the body of the dispensing system, e.g., the body of a dispensing pump or the body (the tube) of a dispensing nozzle. In some embodiments, the electric discharge with the body causes damage to the body and detaches one or more particles from the body. The detached particles from the body may be carried by the dispense material and deposited on the resist pattern that is produced by the dispense material. Thus, in some embodiments, the particles are deposited on the resist pattern that is produced on the substrate. The deposited particles may cause defects in the subsequent steps of the processing of the substrate and, thus, it is desirable to prevent the electric discharge of the dispense material that produces particles in the dispensing system. In some embodiments, the body of the dispensing system is made of or includes electrically conductive material. Additionally, the body of the dispensing system includes one or more low resistivity electrical contacts to the ground. Thus, the electrically conductive material of the body and the grounding of the body may prevent high static charges to remain in the dispense material and subsequently prevent large discharges with the body of the dispensing system and does not produce the particles.

FIG. 1 shows a process flow 100 for generating a resist pattern on a semiconductor substrate by a lithographic system. In some embodiments, the process flow 100 is performed by the control system 600 of FIG. 6 or the computer system 900 of FIGS. 9A and 9B. In operation 102, a resist layer of a resist material is disposed, e.g., coated, on a top surface of a substrate, e.g., a wafer or a work piece. Disposing the resist layer on the top surface of the wafer is described with respect to FIG. 2A. At operation 104, a post application bake (PAB) is performed. The wafer including the resist layer are baked to drive out solvent in the resist material and solidify the resist layer on top of the wafer. In some embodiments, the PAB is performed at a temperature ranging from about 40° C. to about 120° C. At operation 106, the resist layer is irradiated with actinic radiation or a charged particle beam to project a pattern onto the resist layer. In some embodiments, a layout pattern on a mask is projected by EUV radiation from an EUV light source onto the resist layer to generate the layout pattern in the resist layer on the wafer. In some embodiments, portions of the resist layer are exposed to an electron beam from an electron beam source to generate the layout pattern in the resist layer on the wafer. At operation 108, a post exposure bake (PEB) is performed on the wafer and at operation 110, by applying a developer solution, the resist material of the resist layer is developed. In some embodiments, the PEB is performed at a temperature ranging from about 50° C. to about 150° C. For a positive tone resist material, the exposed regions are developed by applying a developer solution and then are removed and the layout pattern is generated in the resist layer. For a negative tone resist material, the non-exposed regions are developed by applying the developer solution and are subsequently removed and the layout pattern is generated in the resist layer. In some embodiments, the developer solution for the negative tone resist material has high electrical resistivity and the static charge collected by the developer solution for the negative tone resist material essentially stays in the developer solution. In the present disclosure, the terms mask, photomask, and reticle are used interchangeably. In addition, the terms resist and photo resist are used interchangeably.

Figure 2B:
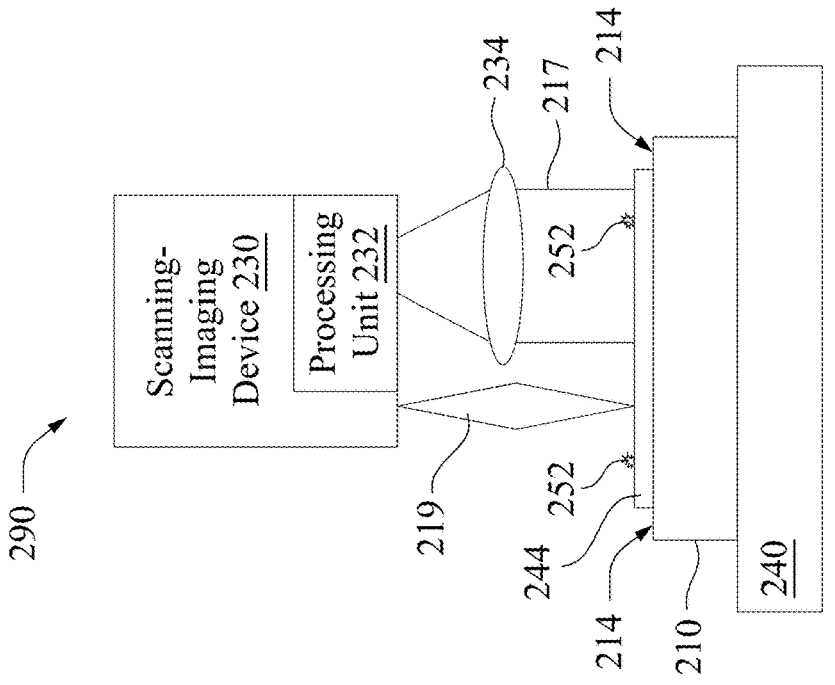
FIGS. 2A and 2B show a dispensing system for dispensing a dispense material on a substrate and inspecting a top surface of the substrate in accordance with some embodiments of the present disclosure.
Figure 2A:
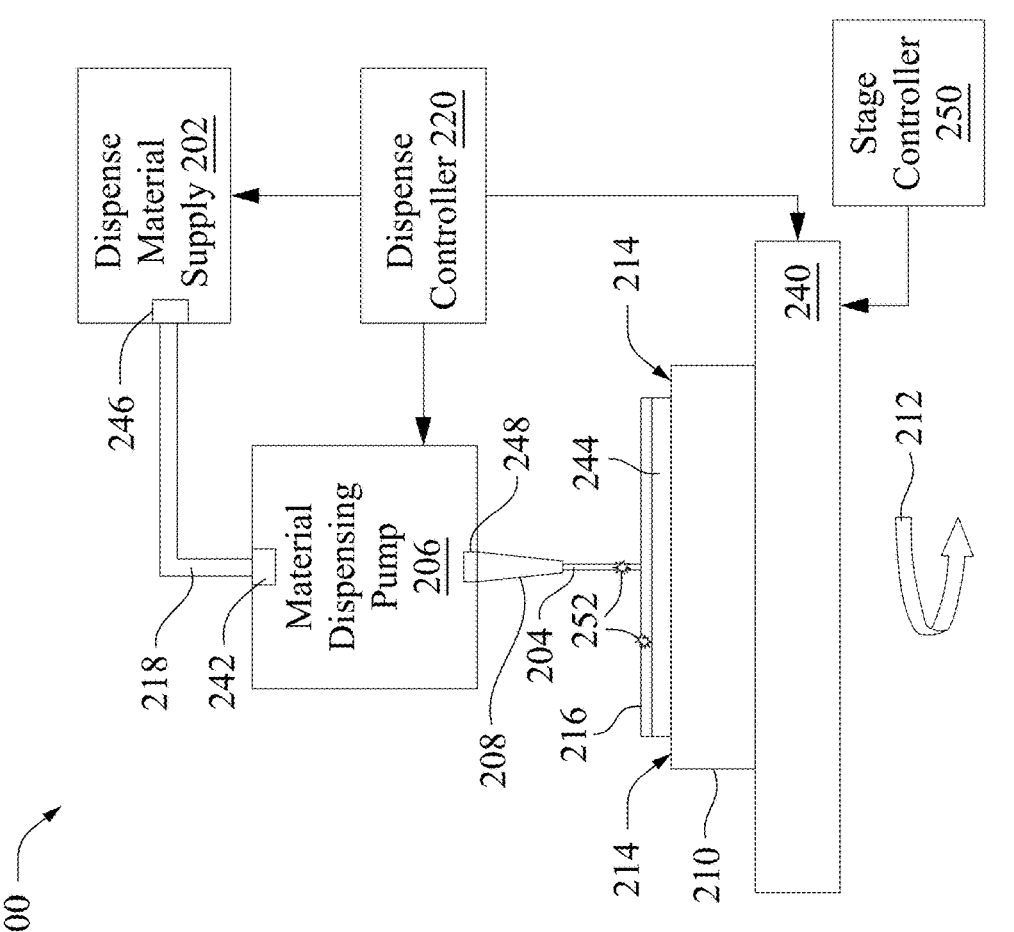

FIGS. 2A and 2B show a dispensing system 200 for dispensing a dispense material on a substrate 210 and inspecting a top surface of the substrate 210 in accordance with some embodiments of the present disclosure. As shown in FIG. 2A, a dispense material 204 is coated on a surface of a substrate 210, e.g., a wafer, to form a coating layer 216 on the substrate 210. In some embodiments, as described above, the dispense material 204 is a developer solution and the coating layer 216 is a developer solution layer that is disposed during the operation 110 of FIG. 1 on a photo resist layer 244. In some embodiments, a dispense controller 220 is coupled to a dispensing pump 206, e.g., a dispensing pump, to control a thickness of the coating layer 216 that is produced on the photo resist layer 244 on the substrate 210. The dispensing system 200 includes a dispensing nozzle 208 and transfers the dispense material from a dispense material supply 202, via a pipe 218 (e.g., a conduit, or a tube) and the dispensing pump 206 to the dispensing nozzle 208. In some embodiments, the substrate 210 is placed on a stage 240 and the stage 240 rotates around a rotation direction 212 to uniformly distribute the dispense material of the dispense material supply 202 on the substrate 210. In some embodiments, a protection film (not shown) is coated on an edge region 214 around an edge of the substrate 210 to prevent the dispense material and the photo resist material from spilling over the edge of the substrate 210. The edge of the substrate is described with respect to FIG. 2B. In some embodiments, the dispense controller 220 is also coupled to a stage controller 250 to synchronize the dispensing of the dispense material and the rotation of the substrate 210. In some embodiments, the substrate 210 is used for manufacturing a semiconductor device and, thus, includes one or more layers of the semiconductor device below the coating layer 216. In some embodiments, the stage 240 rotates around a direction opposite to the rotation direction 212. In some embodiments, the dispensing pump 206 includes the dispensing nozzle 208.

As described, the photo resist layer 244 is sensitive to actinic radiation and the photo resist layer 244 is patterned by exposure to actinic radiation. The chemical properties of the photo resist regions struck by actinic radiation may change in a manner that depends on the type of resist material as described above. In some embodiments, the photo resist layer 244 is a negative tone photo resist material and the dispense material 204 is a developer solution for negative tone photo resist material. In some embodiments, the developer solution for negative tone photo resist materials includes organic solvents. In some embodiments, the developer solution for negative tone photo resist material has high electrical resistivity. When the developer solution flows in the dispensing pump 206 or the dispensing nozzle 208, the motion of the developer solution creates a static electric charge that may be collected in the developer solution. The collected static charge may essentially remain in the developer solution due to the high electrical resistivity. In some embodiments, increasing the flow rate of the developer solution in the dispensing pump 206 or the dispensing nozzle 208 increases the amount of collected static charge and decreasing the flow rate of the developer solution in the dispensing pump 206 or the dispensing nozzle 208 decreases the amount of collected static charge.

In some embodiments, the collected static charge in the dispense material and the distance of the dispense material from the inner surface of the dispensing pump 206 or the dispensing nozzle 208 generates a voltage difference between a portion of the dispense material and the inner surface of the dispensing pump 206 or the dispensing nozzle 208 that is above a threshold voltage level. Thus, the generated voltage difference may generate an electrical discharge, e.g., a spark, with the inner surface of the dispensing pump 206 or the dispensing nozzle 208. In some embodiments, the electric discharge with the inner surface of the dispensing pump 206 or the dispensing nozzle 208 causes damage to the inner surface of the dispensing pump 206 or the dispensing nozzle 208 and detaches, e.g., separates, one or more particles 252 from the inner surface of the dispensing pump 206 or the dispensing nozzle 208. The detached particles 252 may be carried by the dispense material 204 and deposited on the resist pattern that is produced by the dispense material and the deposited particles 252 may cause defects in the subsequent steps of the processing of the substrate.

As shown in FIG. 2A, the dispense controller 220 is coupled to the dispensing pump 206 to control the dispensing pump 206. In some embodiments, the dispense controller 220 turns on, off, or adjusts valves 242 and 248 of the dispensing pump 206 to modify, e.g., adjust, a flow rate (e.g., the speed) of the dispense material 204 inside the dispensing pump 206 and subsequently adjusts the flow rate of the dispense material 204 moving inside the dispensing nozzle 208 and exiting the dispensing nozzle 208. Also, the dispense controller 220 is coupled to the dispense material supply 202 and controls the dispense material supply 202. In some embodiments, the dispense controller 220 turns on, off, or adjusts the valve 246 to turn on, off, or adjust the flow rate of the dispense material 204 exiting the dispense material supply 202.

FIG. 2B illustrates a system 290 for inspecting the resist pattern of the resist layer 244 disposed on the substrate 210 for defects. In some embodiments, the substrate 210 including the resist layer 244 is baked in the PAB operation 104, to drive out solvent in the resist material and solidify the resist layer 244. In some embodiments, the PEB operation 108 is performed on the resist layer 244 after the exposure operation 106 and additionally the operation 110 is performed to develop the resist layer 244. After the development operation 110, the developed resist layer is inspected for defects, e.g., particles. As shown in FIG. 2B, after the development operation 110, a particle 252 that is detached from the inner surface of the dispensing pump 206 or the dispensing nozzle 208 is disposed on the developed resist layer 244.

FIG. 2B also shows a scanning-imaging device 230 that generates a focusing beam 219 for scanning a top surface of the resist layer 244 and generating an image of the top surface of the resist layer 244. Also, FIG. 2B shows the scanning-imaging device 230 and a lens 234 that generates a uniform beam 217 for imaging a top surface of the resist layer 244 and generating the image of the top surface of the resist layer 244 to inspect the top surface of the resist layer 244. In addition, the scanning-imaging device 230 includes a processing unit 232, e.g., an image processing unit, to process the generated image of the top surface of the resist layer 244. In some embodiments, the processing unit 232 performs one or more image processing and/or image recognition algorithms on the generated image of the top surface of the resist layer 244 and determines whether there are one or more defects, e.g., particles, in the generated image. In some embodiments, the processing unit 232 performs a blob analysis and determines the particles in the generated image and ranks the determined particles based on size or severity. In some embodiments, the severity of particles is defined based on the location of the particle, such as proximity to critical features of the layout pattern and whether the particle causes CD non-uniformity. In some embodiments, the focusing beam 219 and the uniform beam 217 are light beams. In some embodiments, the focusing beam 219 is an electron beam. As described with respect to FIG. 2A, a protection region (not shown) is formed in an edge region 214 around an edge of the substrate 210 to prevent the resist material from spilling over the edge of the substrate 210 in some embodiments. In some embodiments, the substrate 210 is placed on a stage, e.g., the stage 240 of FIGS. 2A and the stage controller 250 moves the substrate 210 with respect to the scanning-imaging device 230. In some embodiments, the stage controller 250 coordinates the imaging system and the movement of the substrate 210 and enables the imaging system to capture a pattern of the resist layer 244 disposed on top of the substrate 210 at different locations of the substrate 210.

Figures 3A, 3B, 3C, 3D, 3E:
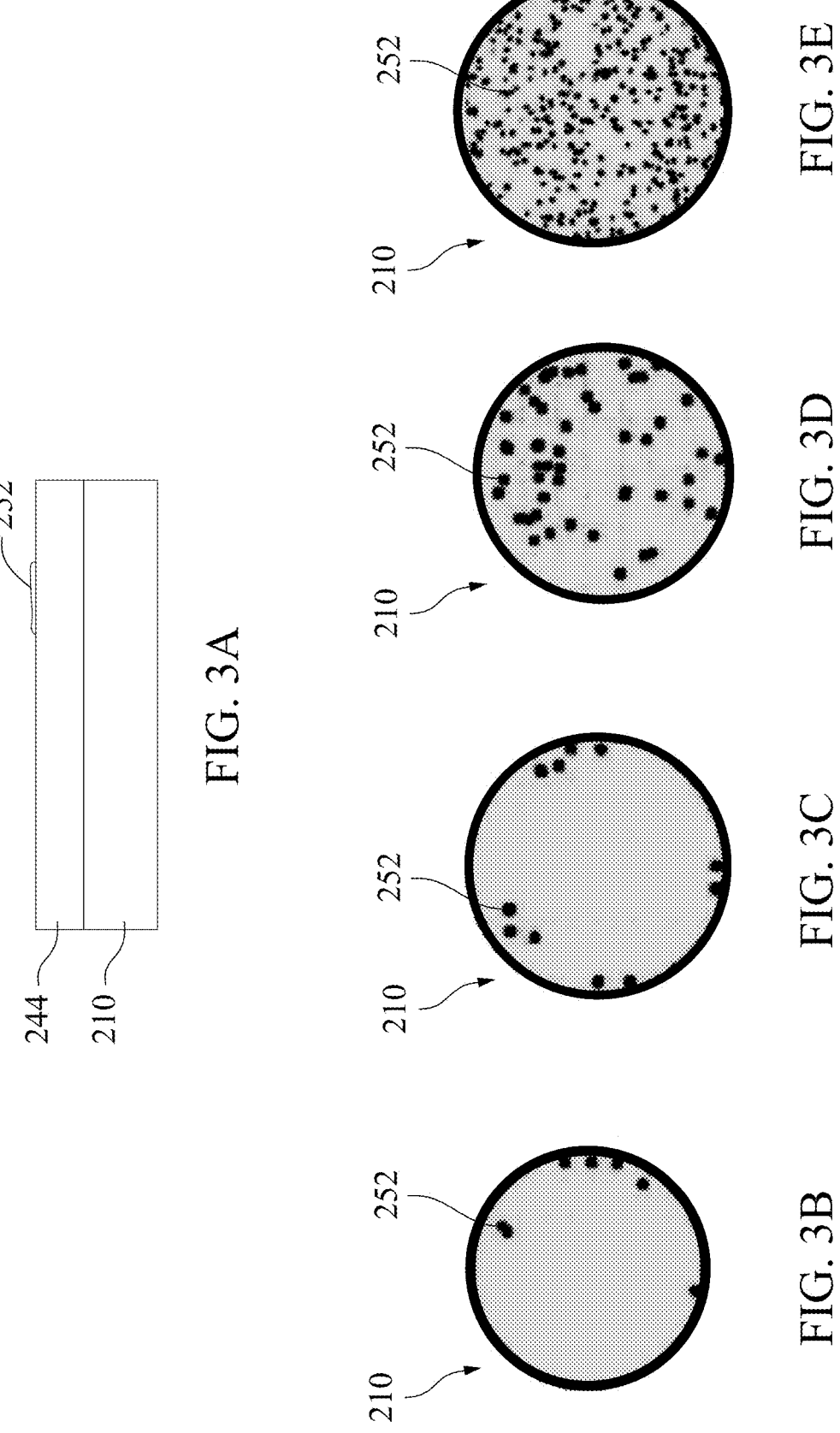
FIGS. 3A, 3B, 3C, 3D, and 3E illustrate particles on the top surface of the substrate.

FIGS. 3A, 3B, 3C, 3D, and 3E illustrate particles on the top surface of the substrate 210. FIG. 3A shows the substrate 210 with the resist layer 244 on top of the substrate 210. As discussed, the resist layer 244 is inspected after the development operation 110 in some embodiments. The resist layer 244 may have a defect, such as the particle 252 in the resist layer 244. In some embodiments, the particle 252 is removed after the development operation 110, however, a void is created and the remaining portion of the resist layer 244 under the particle 252 may not have enough thickness to protect the devices under the resist layer 244 in subsequent process steps.

FIGS. 3B, 3C, 3D, and 3E illustrate surfaces of the photo resist layers 244 with particles 252 on the surfaces. In some embodiments, a scanning-imaging device, e.g., the scanning-imaging device 230 described above with respect to FIG. 2B is used to inspect the surface of the developed resist layer 244. Images obtained by the scanning imaging device are inspected and the number and locations of the particles 252 on the resist layer 244 are determined. As shown in FIGS. 3B, 3C, 3D, and 3E, the numbers of particles 252 increases in each successive figure. In addition, FIGS. 3B, 3C, and 3E have larger particles 252 compared to FIG. 3D, however, FIG. 3D has a greater number of smaller particles 252. The number of particles may be determined, e.g., calculated as a total number of particles on a wafer, or calculated as a map of the number of particles in unit areas, e.g., in each square millimeter of the top surface of the substrate 210. In some embodiments, a threshold number of particles or threshold particle size is determined, and the wafers containing particles above the threshold number of particles are rejected. In some embodiments, the threshold number of particles of the wafer is between 0 and about 3000. In some embodiments, the threshold particle size is a number between about 5 nm and about 20 nm and the particles having a size larger than the threshold particle size are counted in the number of particles.

FIGS. 4A and 4B show the dispensing pump 206 in accordance with some embodiments of the present disclosure. As shown in FIG. 4A, the dispensing pump 206 includes a body 425 that surrounds an enclosure 435. The body 425 includes an input port 445 and an output port 440. The input port 445 is connected to the pipe 218. As shown in FIG. 2A, the input port 445 is connected to the dispense material supply 202 via the pipe 218 and the dispense material 204 enters the enclosure 435 of the dispensing pump 206 via the pipe 218 and through the input port 445. As shown in FIG. 4A, the valve 242 is mounted in the input port 445 and controls the input port 445. In some embodiments, the dispense controller 220 that is coupled to the dispensing pump 206, controls the dispensing pump 206 and, for example, turns on, off, or adjusts the valve 242 to turn on, off, or adjust the flow of the dispense material 204 that enters the dispensing pump 206.

As shown, the output port 440 is connected to the dispensing nozzle 208 and the dispense material 204 leaves the enclosure 435 of the dispensing pump 206 to the dispensing nozzle 208 through the output port 440. As shown in FIG. 4A, the valve 248 is mounted in the output port 440 and controls the flow rate of the dispense material 204 through the output port 440. In some embodiments, the dispense controller 220 that is coupled to the dispensing pump 206, controls the dispensing pump 206 and, for example, turns on, off, or adjusts the valve 248 to turn on, off, or adjust the flow of the dispense material 204 that leaves the dispensing pump 206. In some embodiments, the dispensing pump 206 includes one or more parts inside the enclosure 435, e.g., an O-ring 404 to prevent leakage of the dispense material 204 and a diaphragm 406 to direct the dispense material 204 inside the enclosure 435 of the dispensing pump 206.

In some embodiments, while the dispense material 204 move through the enclosure 435 of the dispensing pump 206 between the input port 445 and the output port 440, the motion of the dispense material 204 and being rubbed against the inner surface of the body 425 or the parts inside the enclosure 435 generates an electrostatic charge that may be collected in the dispense material 204. In some embodiments, the dispense material 204 have high electrical resistivity and, thus, the collected electrostatic charge stays in the dispense material 204 and generates a high voltage difference, e.g., a voltage difference of few hundred volts, between portions of the dispense material 204 and the inner surface of the body 425 or between portions of the dispense material 204 and the parts inside the enclosure 435. In some embodiments, the high voltage difference between the dispense material 204 and the inner surface of the body 425 and between the dispense material 204 and the parts inside the enclosure 435, generates one or more electrical discharges between the dispense material 204 and the inner surface of the body 425 and/or the parts inside the enclosure 435. In some embodiments, the electric discharge detaches one or more particles 252 from the inner surface of the body 425 and/or from the parts inside the enclosure 435. In some embodiments, the detached particles 252 are carried by the dispense material 204 as shown in FIGS. 2A and 2B and are deposited over the resist layer 244. In some embodiments, the dispense material 204 is a developer solution for development of negative tone photo resist of an EUV lithography system and the electrostatic charge collected in the developer solution generates a high voltage difference, e.g., a voltage difference of about 1500 volts between the developer solution and the inner surface of the body 425 and/or the parts inside the enclosure 435. In some embodiments, the detachment of the particles 252 from the various components inside the enclosure 435, e.g., the detachment of the particles 252 from the diaphragm 406, the O-ring 404, or the valve 248, causes leakage of the dispense material 204 in the dispensing pump 206.

FIG. 4B shows an outer surface 442 of the body 425 of the dispensing pump 206. As shown electrical contacts 402 are disposed on the outer surface 442 of the body 425. The electrical contacts 402 are connected via electrically conductive connection wires 422 to ground 420. In some embodiments, the body 425 of the dispensing pump 206 in made of or includes electrically conductive material. In some embodiments, the electrically conductive material of the body 425 is either a combination of polymer and graphite or is stainless steel. The graphite provides electrical conductivity to the polymer. In some embodiments, the polymer is a polyolefin; such as polyethylene, polypropylene, or polybutylene; or a fluoropolymer. In some embodiments, the stainless steel is an electronic grade stainless steel. In some embodiments, the electrical contacts 402 are ohmic contacts and the connection wires 422 are low resistivity connection wires with a resistance of about 1 ohm. In some embodiments, because the body 425 is electrically conductive, the electrostatic charge of the dispense material 204 is distributed in the body 425 and gets transferred to the ground 420 through multiple connection wires 422 and, thus, the probability of large discharges between the dispense material 204 and the body 425 is reduced. In some embodiments, electrically conductive material of the body 425 and the connection wires 422 between the body 425 and the ground 420 also reduces the probability of large discharges between the dispense material 204 and the components inside the enclosure 435. Therefore, the number of particles 252 that are detached from the body 425 or the parts inside the enclosure 435 is reduced. In some embodiments, electrical contacts 402 and the connection wires 422 are made of or include suitable non-corrosive and conductive metals such as silver, copper, gold, platinum, or palladium.

FIGS. 5A and 5B show the dispensing nozzle 208 of the dispensing pump 206 in accordance with some embodiments of the present disclosure. As shown, the dispensing nozzle 208 includes a tube 525 having an entrance port 545 that is aligned with the output port 440 of the dispensing pump 206 where the dispense material 204 enters an enclosure 535 of the tube 525. The tube 525 also includes a tip 540 where the dispense material 204 exits from the dispensing nozzle 208 and is dispensed on a substrate, e.g., the substrate 210 of FIG. 2A. In some embodiments, while the dispense material 204 flows through the enclosure 535 of the tube 525 between the entrance port 545 and the tip 540, the motion of the dispense material in the enclosure 535 and being rubbed against the inner surface of the tube 525 causes electrostatic charge being collected in the dispense material 204.

FIG. 5B shows an outer surface 542 of the tube 525 of the dispensing nozzle 208. As shown electrical contacts 402 are disposed on the outer surface 542 of the tube 525. The electrical contacts 402 are connected via electrically conductive connection wires 422 to the ground 420. In some embodiments, the tube 525 of the dispensing nozzle 208 is made of or includes electrically conductive material. In some embodiments, the electrically conductive material of the tube 525 is either a combination of a polymer and graphite or is stainless steel. In some embodiments, the polymer is a polyolefin; such as polyethylene, polypropylene, or polybutylene; or a fluoropolymer. In some embodiments, the stainless steel is an electronic grade stainless steel . . . In some embodiments, the electrical contacts 402 are ohmic contacts and the connection wires 422 are low resistivity connection wires. In some embodiments, because of the tube 525 is electrically conductive, the electrostatic charge or a portion of the electrostatic charge of the dispense material 204 is distributed in the tube 525 and is transferred to the ground 420 through multiple connection wires 422 and, thus, the probability of large discharges between the dispense material 204 and the tube 525 is reduced. In some embodiments, the number of electrical contacts 402 that are disposed, e.g., mounted, on the outer surface 542 of the tube 525 is between 2 and about 100. In some embodiments, a length/width of the electrical contacts 402 that are disposed on the outer surface 542 of the tube 525 is between about 5 mm and 50 mm. In some embodiments, the density of electrical contacts 402 that are disposed on the outer surface 542 of the tube 525 is between about 0.1 to about 2 $cm^{-2}$. In some embodiments, the density of electrical contacts 402 is increased at proximity of the diaphragm 406, the O-ring 404, or the valve 248.

Figure 6:
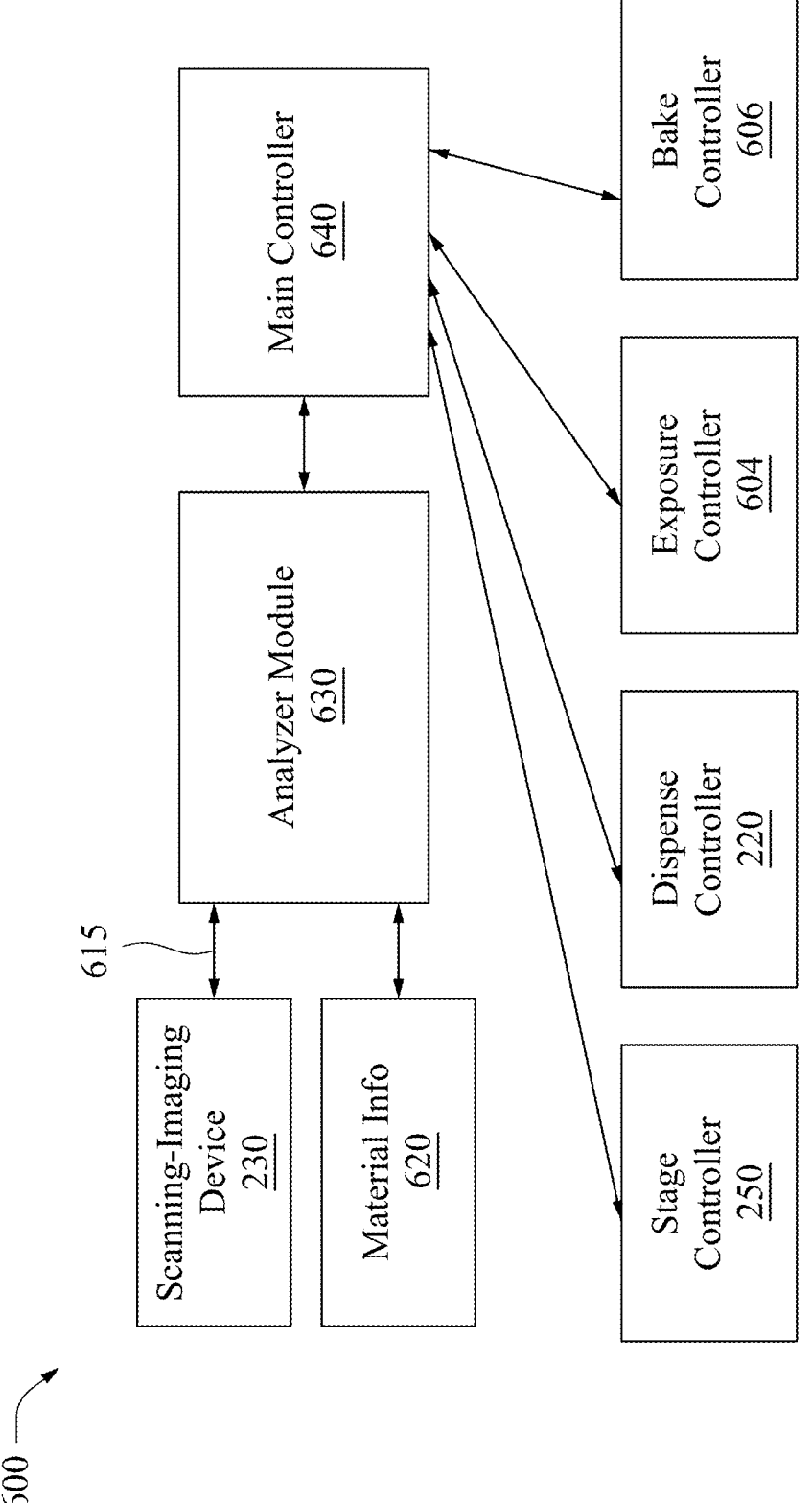
FIG. 6 shows a control system for operating a dispensing system and generating a resist pattern over a substrate in accordance with some embodiments of the present disclosure in accordance with some embodiments of the present disclosure.

FIG. 6 shows a control system 600 for operating a dispensing system and generating a resist pattern over a substrate in accordance with some embodiments of the present disclosure in accordance with some embodiments of the present disclosure. The control system 600 includes an analyzer module 630 and a main controller 640 coupled to each other. In some embodiments, the control system 600 includes the stage controller 250 of FIG. 2A, the dispense controller 220 of FIG. 2A, an exposure controller 604 for performing the exposure operation 106 of FIG. 1, a bake controller 606 for performing the PAB operation 104 and the PEB operation 108 of FIG. 1, and the scanning-imaging device 230 of FIG. 2B. In some embodiments, the main controller 640 is coupled to and controls the stage controller 250, the dispense controller 220, and the scanning-imaging device 230. In some embodiments, referring to FIG. 2A, the main controller 640 commands the dispense controller 220, to direct the dispense material 204, via the pipe 218, from the dispense material supply 202 to the dispensing pump 206, and also to direct the dispense material 204, via the dispensing nozzle 208 to the substrate 210. In some embodiments, the main controller 640 commands the stage controller 250 to rotate the stage 240 in the rotation direction 212 to uniformly distribute the dispense material 204 of the dispense material supply 202 on the substrate 210. In some embodiments, the main controller 640 commands one or more of the valves 246, 242, and 248 of the respective dispense material supply 202 or the dispensing pump 206 to turn on, off, or adjust the flow of the dispense material 204 exiting the dispensing nozzle 208.

In some embodiments, the main controller 640 commands the stage controller 250 to move the stage 240 with respect to the scanning-imaging device 230 and to direct the uniform beam 217 at different locations of the substrate to capture a resist pattern of the resist layer 244 disposed on top of the substrate 210 at different locations of the substrate 210. In some embodiments, the analyzer module 630 receives the captured resist pattern 615, e.g., receives the image of the resist pattern at different locations of the substrate 210. In some embodiments, the analyzer module 630 determines the particles, e.g., counts the number of particles, disposed at different locations of the substrate 210. In some embodiments, the analyzer module 630 compares the counted number of particles at different locations with a threshold number of particles. If the counted number of particles, at one or more locations, is above the threshold number of particles, the analyzer module 630 sends a signal to the main controller 640 to slow the flow rate of the dispense material 204. In response, the main controller commands one or more of the valves 246, 242, and 248 via the dispense controller 220 to reduce the flow rate of the dispense material 204. In some embodiments, if the analyzer module 630 determines that the counted number of particles at each location is considerably, e.g., at least 25 percent, below threshold number of particles, the analyzer module 630 sends a signal to the main controller 640 to increase the flow rate of the dispense material 204. In some embodiments, the analyzer module 630 receives material info 620, which is the information of the dispense material 204, and the signal that is sent to the main controller 640 is based on the material info 620 and determines the amount of change to the flow rate of the dispense material 204. In some embodiments, when the counted number of particles, at one or more locations on the substrate 210, is above the threshold number of particles, the density of electrical contacts 402 that are mounted on the outer surface 542 of the tube 525 are increased. The number of particles is determined either as the total number of particles on the substrate or as a density of the number of particles per unit area, e.g., $cm^2$ or $mm^2$. In some embodiments, each location is a unit area.

Figure 7:
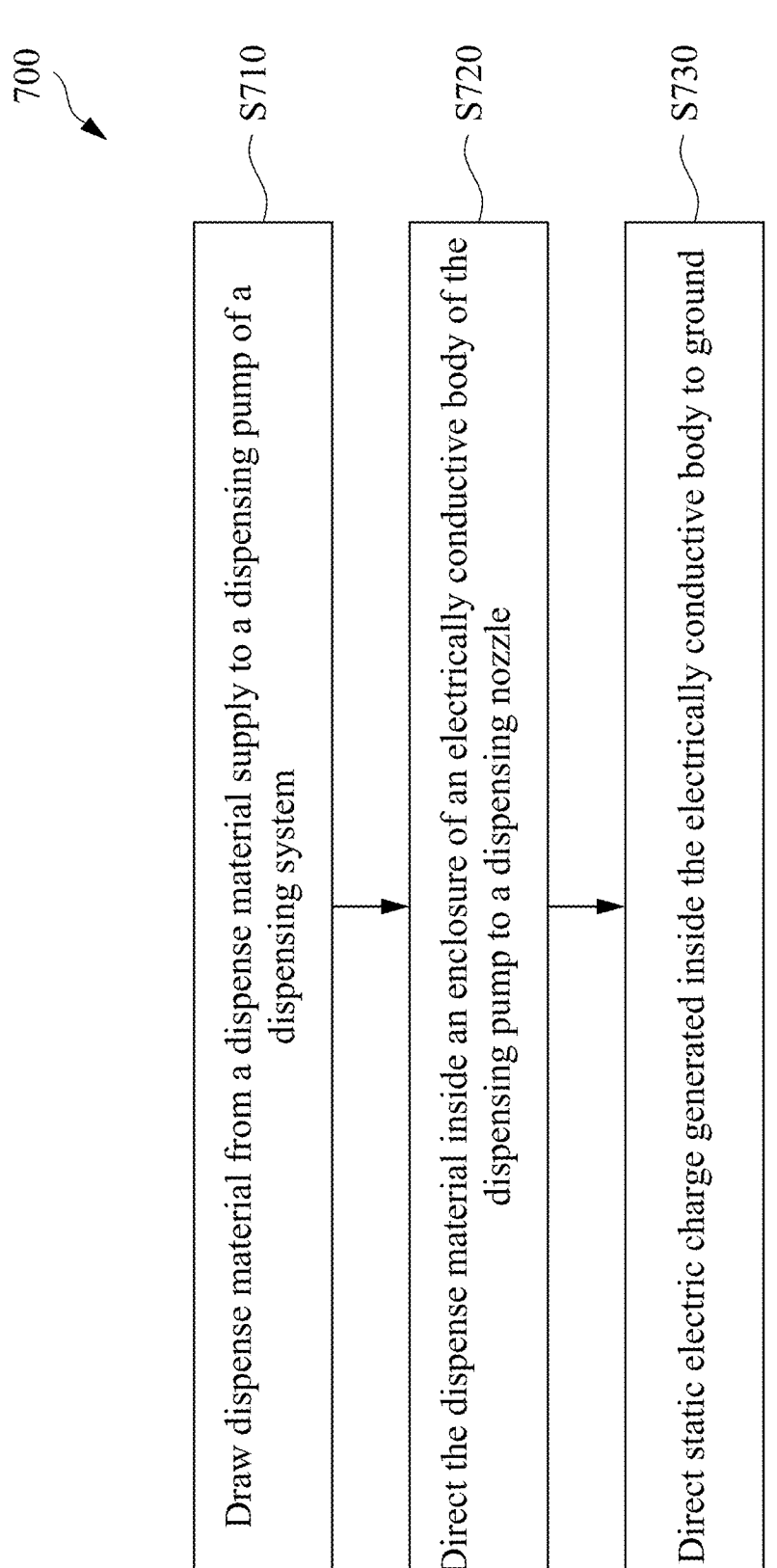
FIG. 7 illustrates a flow diagram of a process for operating a dispensing system in accordance with some embodiments of the present disclosure.

FIG. 7 illustrates a flow diagram of a process 700 for inspecting the particles on a mask pod in accordance with some embodiments of the present disclosure. The process 700 or a portion of the process 700 may be performed by the system of FIG. 2A. In some embodiments, the process 700 or a portion of the process 700 is performed and/or is controlled by the computer system 900 described below with respect to FIGS. 9A and 9B. In some embodiments, the process 700 or a portion of the process 700 is performed by the control system 600 of FIG. 6 described above. The method includes an operation S710, where dispense material is drawn from a dispense material supply to a dispensing pump of a dispensing system. As shown in FIG. 2A, the dispense material 204 is drawn from dispense material supply 202, via the pipe 218, and the dispense material 204 is provided to the dispensing pump 206 of the dispensing system 200 of FIG. 2A. In operation S720, the dispense material inside an enclosure of an electrically conductive body of the dispensing pump is directed to a dispensing nozzle. In some embodiments, as shown in FIG. 2A, the dispense material 204 inside the enclosure 435 of the electrically conductive body 425 of the dispensing pump 206 is directed to the dispensing nozzle 208. In operation S730, static electric charge generated inside the electrically conductive body is directed to ground. As shown in FIG. 4B, the static electric charge generated inside the enclosure 435 of the electrically conductive body 425 is directed to the ground 420 via electrical contacts 402 and the connection wires 422. In some embodiments, a portion of the static electric charge generated inside the enclosure 435 is directed to the ground 420.

Figure 8:
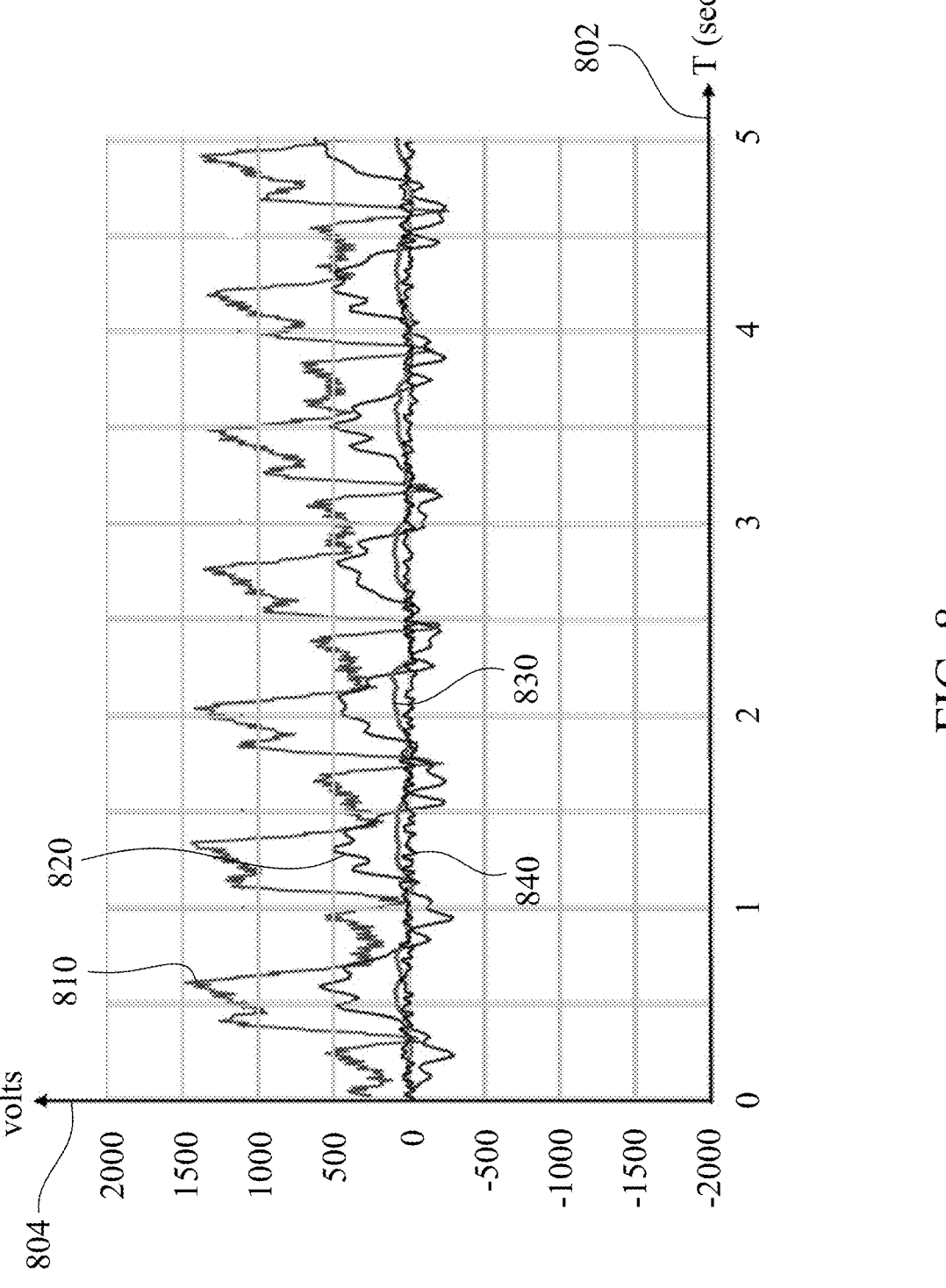
FIG. 8 illustrates graphs of voltage variations of the body of the dispensing pump in accordance with some embodiments of the present disclosure.

FIG. 8 illustrates graphs of voltage variations of the body of the dispensing pump in accordance with some embodiments of the present disclosure. The graphs are shown on voltage coordinate 804 versus time coordinate 802. The graph 810 is the voltage variation of the body of a dispensing pump, e.g., the dispensing pump 206 having an ungrounded body 425 made of electrically insulating polytetrafluoroethylene (PTFE). As shown, the voltage transferred to the body 425 due to electrostatic discharge of the dispense material 204, e.g., a developer solution for negative tone photo resist, is as high as 1500 volts. The high transferred voltage is caused by sparks between the dispense material 204 and the PTFE body 425 and, thus, PTFE particles may be detached from the body 425. In some embodiments, the pipe 218 is also grounded.

The graph 820 is the voltage variation of the body 425 of the dispensing pump 206 when the body 425 is made of an ungrounded electrically conductive stainless steel. As shown, the voltage transferred to the body 425 due to the electrostatic discharge of the dispense material 204 is as high as 500 volts. This moderate transferred voltage is caused by sparks between the dispense material 204 and the stainless steel body 425. Fewer particles are detached from the body 425 compared to the PTFE body. The graph 830 is the voltage variation of the body 425 of the dispensing pump 206 when the body 425 is made of grounded PTFE. The PTFE body 425 is connected to the ground 420 via the electrical contacts 402 and the connection wires 422. As shown, in the graph 830, the voltage transferred to the body 425 due to electrostatic discharge of the dispense material 204 is as high as 110 volts. The graph 840 is the voltage variation of the body 425 of the dispensing pump 206 when the body 425 is made of stainless steel and the body 425 is connected to the ground 420 via the electrical contacts 402 and the connection wires 422. As shown, in the graph 840, the voltage transferred to the body 425 due to discharge of the dispense material 204 is as high as 60 volts. Thus, in comparison with other approaches, there is a smaller probability of particles being detached from the body 425 when the body 425 is grounded and the probability gets even smaller for a stainless steel body.

Figures 9A, 9B:
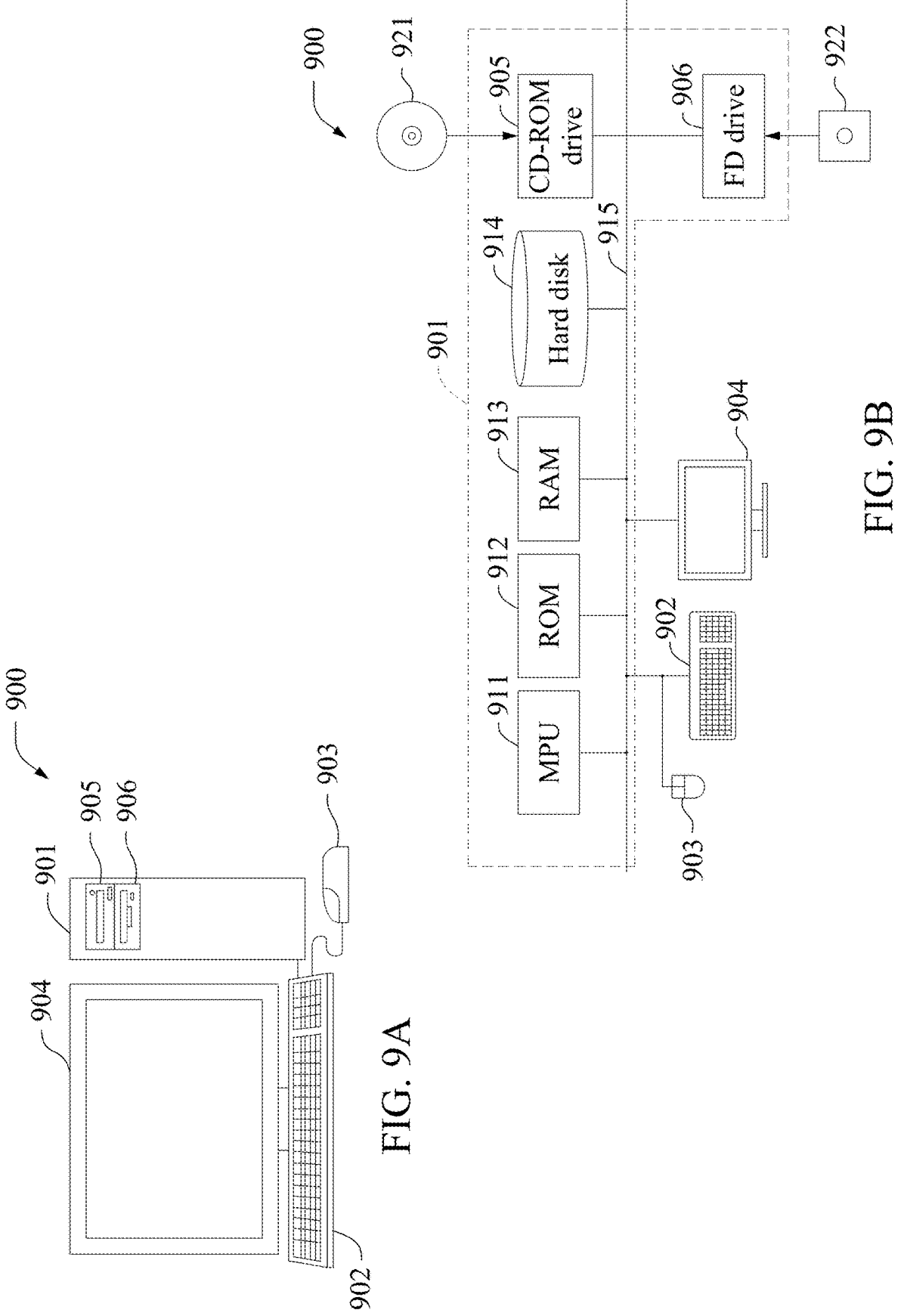
FIGS. 9A and 9B illustrate an apparatus for operating a dispensing system and generating a resist pattern on a substrate in accordance with some embodiments of the present disclosure.

FIGS. 9A and 9B illustrate an apparatus for operating a dispensing system and generating a resist pattern on a substrate in accordance with some embodiments of the present disclosure. In some embodiments, the computer system 900 is used for performing the functions or a portion of the functions of the modules of FIG. 6 that include the main controller 640, the analyzer module 630, the stage controller 250, the dispense controller 220, the exposure controller 604, the bake controller 606, and the scanning-imaging device 230.

FIG. 9A is a schematic view of a computer system that performs the functions of an apparatus for operating a dispensing system and generating a resist pattern on a substrate. All of or a part of the processes, method and/or operations of the foregoing embodiments can be realized using computer hardware and computer programs executed thereon. In FIG. 9A, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 9B is a diagram showing an internal configuration of the computer system 900. In FIG. 9B, the computer 901 is provided with, in addition to the optical disk drive 905 and the magnetic disk drive 906, one or more processors, such as a micro processing unit (MPU) 911, a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN The program for causing the computer system 900 to execute the functions of the control system for controlling the dispensing of the dispense material and generating a resist pattern on a substrate in the foregoing embodiments may be stored in an optical disk 921 or a magnetic disk 922, which are inserted into the optical disk drive 905 or the magnetic disk drive 906, and transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network. The program does not necessarily have to include, for example, an operating system (OS) or a third party program to cause the computer 901 to execute the functions of the control system for the dispensing of the dispense material on a substrate and generating a pattern in a resist material layer in the foregoing embodiments. The program may only include a command portion to call an appropriate function (module) in a controlled mode and obtain desired results.

According to some embodiments of the present disclosure, a dispensing system includes a dispense material supply to contain a dispense material. The dispensing system also includes a dispensing pump connected downstream from the dispense material supply. The dispensing pump includes a body that includes a first electrically conductive material, one or more first electrical contacts disposed on the body of the dispensing pump, and one or more first connection wires coupled between each one of the one or more first electrical contacts and ground. The dispensing system further includes a dispensing nozzle connected downstream from the dispensing pump that includes a tube that includes a second electrically conductive material, one or more second electrical contacts disposed on an outer surface of the tube, and one or more second connection wires coupled between each one of the one or more second electrical contacts and the ground. In an embodiment, the dispensing system further includes a pipe coupled between the dispense material supply and the dispensing pump. The pipe directs a flow of the dispense material from the dispense material supply to the dispensing pump. In an embodiment, the dispensing pump directs the flow of the dispense material from the dispensing pump through the dispensing nozzle onto a wafer mounted on top of a wafer stage downstream from the dispensing nozzle. In an embodiment, the first electrically conductive material of the body either includes a combination of a polymer and graphite or stainless steel. The first electrical contacts are disposed on an outer surface of the body and conduct static electric charge generated inside the body through the first connection wires to the ground. In an embodiment, the second electrically conductive material of the tube either includes a combination of polypropylene and graphite or includes electronic grade stainless steel. The second electrical contacts conduct static electric charge generated inside the tube through the second connection wires to the ground. In an embodiment, the first electrical contacts and the second electrical contacts are ohmic contacts. In an embodiment, the first electrically conductive material of the body includes polypropylene and graphite.

According to some embodiments of the present disclosure, a dispensing pump includes a body that includes an electrically conductive material and has an input port and an output port. A dispense material enters an enclosure inside the body from the input port and exit the enclosure through the output port. The dispensing pump also includes one or more electrical contacts disposed on an outer surface of the body. The dispensing pump further includes one or more connection wires coupled between each one of the one or more electrical contacts and ground. The electrical contacts conduct static electric charge generated inside the body through the connection wires to the ground. In an embodiment, the electrically conductive material of the body includes polypropylene and graphite. In an embodiment, the input port includes a first valve and the output port includes a second valve. The dispense material enters the enclosure from the first valve and exits the enclosure via the second valve. In an embodiment, the dispensing pump further includes a diaphragm in the enclosure that moves the dispense material from the input port to the output port. In an embodiment, at least one of the electrical contacts on the outer surface of the body is adjacent the diaphragm. In an embodiment, the electrically conductive material of the body either includes a combination of a polymer and graphite or includes stainless steel. In an embodiment, the dispensing pump further includes a dispensing nozzle that is connected to the body via the output port. The dispensing nozzle includes a tube that includes the electrically conductive material, one or more second electrical contacts disposed on an outer surface of the tube, and one or more second connection wires coupled between each one of the one or more second electrical contacts and the ground.

According to some embodiments of the present disclosure, a method of operating a dispensing system includes drawing dispense material from a dispense material supply of the dispensing system to a dispensing pump of the dispensing system. The method also includes directing the dispense material inside an enclosure of an electrically conductive body of the dispensing pump to a dispensing nozzle. The method further includes directing static electric charge generated inside the electrically conductive body to ground. The static electric charge is directed through the electrically conductive body and one or more connection wires coupled between an outer surface of the electrically conductive body and the ground. In an embodiment, one or more electrical contacts are disposed on an outer surface of the electrically conductive body, the method further incudes directing the static electric charge through the one or more electrical contacts from the electrically conductive body to the ground. In an embodiment, the method further includes directing the dispense material through the dispensing nozzle onto a wafer mounted on top a wafer stage, inspecting a top surface of the wafer for particles deposited on the top surface of the wafer, determining a number of particles deposited on the top surface of the wafer, and adjusting a flow rate of the dispense material through the dispensing pump based on the number of particles. In an embodiment, the method further includes directing a portion of the static electric charge generated inside an electrically conductive tube of the dispensing nozzle to the ground. The portion of the static electric charge is directed through the electrically conductive tube and one or more additional connection wires coupled between an outer surface of the electrically conductive tube and the ground. In an embodiment, the method further includes drawing the dispense material through an input valve of an input port of the electrically conductive body to the dispensing pump of the dispensing system, and turning on or off an input flow to the enclosure of the electrically conductive body by the input valve.

In an embodiment, the method further includes directing the dispense material inside the enclosure of the electrically conductive body of the dispensing pump to the dispensing nozzle through an output valve of an output port of the electrically conductive body, and turning on or off an output flow out of the enclosure of the electrically conductive body by the output valve. As described above, the foregoing embodiments, prevents or reduces the electric discharges between the dispense material and the dispensing pump and, thus, reduces the amount of particles that are disposed on resist patterns that are generated on wafers.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A dispensing system, comprising:
a dispense material supply configured to contain a dispense material;
a dispensing pump connected downstream from the dispense material supply, the dispensing pump comprising:
a body comprised of a first electrically conductive material, the first electrically conductive material comprises stainless steel;
a plurality of first electrical contacts disposed on the body of the dispensing pump, the plurality of first electrical contacts are arranged in a row from a first edge of the body to a second edge of the body; and
one or more first connection wires coupled between each one of the one or more first electrical contacts and ground;
a dispensing nozzle connected downstream from the dispensing pump comprising:
a tube comprised of a second electrically conductive material;
a plurality of second electrical contacts disposed on an outer surface of the tube at a density of 0.1 to 2 $cm^{-2}$, wherein the plurality of second electrical contacts are stacked in a row from an entrance portion of the tube to a tip of the tube; and
a plurality of second connection wires coupled between each one of the plurality of second electrical contacts and the ground; and
a dispense controller configured to control the dispensing pump to increase or decrease a flow of the dispense material from the dispensing pump through the dispensing nozzle onto a wafer mounted on top of a wafer stage downstream from the dispensing nozzle,
wherein the increase or decrease in the flow of the dispense material is controlled based on a number of particles counted on a surface of the wafer relative to a threshold number of particles.

2. The dispensing system of claim 1, further comprising:
a pipe coupled between the dispense material supply and the dispensing pump, wherein the pipe is configured to direct the flow of the dispense material from the dispense material supply to the dispensing pump.

3. The dispensing system of claim 1, wherein the plurality of first electrical contacts are disposed on an outer surface of the body and configured to conduct static electric charge generated inside the body through the one or more first connection wires to the ground.

4. The dispensing system of claim 1, wherein the second electrically conductive material of the tube comprises electronic grade stainless steel.

5. The dispensing system of claim 4, wherein the plurality of second electrical contacts are configured to conduct static electric charge generated inside the tube through the plurality of second connection wires to the ground.

6. The dispensing system of claim 1, wherein the plurality of first electrical contacts and the plurality of second electrical contacts are ohmic contacts.

7. The dispensing system of claim 1, wherein a length of the plurality of second electrical contacts is from 5 mm to 50 mm.

8. A dispensing pump, comprising:
a body comprised of an electrically conductive material and having an input port and an output port, wherein a dispense material is configured to enter an enclosure inside the body from the input port and exit the enclosure through the output port, and wherein the electrically conductive material comprises stainless steel;
a plurality of first electrical contacts disposed on an outer surface of the body, the plurality of first electrical contacts are arranged in a row from a first edge of the body to a second edge of the body;
one or more first connection wires coupled between each one of the one or more first electrical contacts and ground, wherein the one or more first electrical contacts are configured to conduct static electric charge generated inside the body through the one or more first connection wires to the ground;

a dispensing nozzle connected to the body via the output port, the dispensing nozzle comprising:

a tube comprised of the electrically conductive material;

a plurality of second electrical contacts disposed on an outer surface of the tube at a density of 0.1 to 2 $cm^{-2}$, wherein the plurality of second electrical contacts are stacked in a row from an entrance portion of the tube to a tip of the tube; and a plurality of second connection wires coupled between each one of the plurality of second electrical contacts and the ground; and a dispense controller configured to control the dispensing pump by controlling the input port of the body to increase or decrease a flow of the dispense material.

9. The dispensing pump of claim 8, wherein the input port comprises a first valve and the output port comprises a second valve.

10. The dispensing pump of claim 9, wherein the dispense material is configured to enter the enclosure from the first valve and to exit the enclosure via the second valve.

11. The dispensing pump of claim 8, further comprising a diaphragm in the enclosure configured to move the dispense material from the input port to the output port.

12. The dispensing pump of claim 11, wherein the plurality of the first electrical contacts are disposed at an increased density on the outer surface of the body proximal to the diaphragm.

13. The dispensing pump of claim 11, wherein at least one of the one or more first electrical contacts on the outer surface of the body is adjacent the diaphragm.

14. The dispensing pump of claim 8, wherein the dispensing pump is connected downstream from a dispense material supply via a pipe.

15. A dispensing system, comprising:

a dispensing pump connected from a dispense material supply and comprising:

a body comprising a plurality of first electrical contacts disposed thereon, the plurality of first electrical contacts are arranged in a row from a first edge of the body to a second edge of the body and wherein the body comprises stainless steel, and one or more first connection wires coupled between each of the one or more first electrical contacts and ground;

a dispensing nozzle connected downstream from the dispensing pump and comprising:

a tube comprising a plurality of second electrical contacts disposed on an outer surface thereof at a density of 0.1 to 2 $cm^{-2}$, wherein the plurality of second electrical contacts are stacked in a row from an entrance portion of the tube to a tip of the tube, and a plurality of second connection wires coupled between each of the plurality of second electrical contacts and the ground; and a dispense controller configured to control the dispensing pump by controlling a valve to increase or decrease a flow of dispense material through the dispensing nozzle onto a wafer mounted on top of a wafer stage downstream from the dispensing nozzle, wherein the increase or decrease in the flow of the dispense material is controlled based on a number of particles counted on a surface of the wafer relative to a threshold number of particles.

16. The dispensing system of claim 15, wherein the dispensing pump is connected downstream from the dispense material supply via a pipe.

17. The dispensing system of claim 16, wherein the body comprises an input and an output ports.

18. The dispensing system of claim 17, further comprising a diaphragm in the body configured to move the dispense material from the input port to the output port.

19. The dispensing system of claim 18, wherein at least one of the plurality of second electrical contacts on the outer surface of the body is adjacent the diaphragm.

20. The dispensing system of claim 17, wherein a dispense material is configured to enter the body from the input port and exit the body through the output port, and wherein the valve is mounted in the input port.

* * * * *